United States Patent
Kobayashi et al.

(10) Patent No.: US 8,501,088 B2
(45) Date of Patent: Aug. 6, 2013

(54) SOLDER ALLOY, SOLDER BALL AND ELECTRONIC MEMBER HAVING SOLDER BUMP

(75) Inventors: Takayuki Kobayashi, Tokyo (JP); Tsutomu Sasaki, Tokyo (JP); Masamoto Tanaka, Tokyo (JP); Katsuichi Kimura, Iruma (JP)

(73) Assignees: Nippon Steel & Sumikin Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 683 days.

(21) Appl. No.: 12/345,942

(22) Filed: Dec. 30, 2008

(65) Prior Publication Data
US 2009/0196789 A1    Aug. 6, 2009

(30) Foreign Application Priority Data

Oct. 29, 2008   (JP) ................................. 2008-278877

(51) Int. Cl.
*C22C 13/00*    (2006.01)
(52) U.S. Cl.
USPC ......................................... 420/561; 420/557
(58) Field of Classification Search
None
See application file for complete search history.

(56) References Cited

U.S. PATENT DOCUMENTS

| | | | | |
|---|---|---|---|---|
| 4,814,235 A | * | 3/1989 | Hecht et al. | 428/586 |
| 6,080,497 A | * | 6/2000 | Carey et al. | 428/647 |
| 2004/0140022 A1 | * | 7/2004 | Inohana et al. | 148/553 |
| 2004/0141873 A1 | * | 7/2004 | Takemoto et al. | 420/557 |

FOREIGN PATENT DOCUMENTS

| | | |
|---|---|---|
| JP | 2-70033 A | 3/1990 |
| JP | 05050286 | 3/1993 |
| JP | 10-183229 A | 7/1998 |
| JP | 11-791 A | 1/1999 |
| JP | 2000-15479 A | 1/2000 |
| JP | 2001-279351 A | 10/2001 |
| JP | 2002239780 | 8/2002 |
| JP | 2005319470 | 11/2005 |
| JP | 2006-167800 A | 6/2006 |
| JP | 2006159266 | 6/2006 |
| JP | 2008-30047 A | 2/2008 |
| WO | WO 2005057732 A1 * | 6/2005 |
| WO | WO 2006032933 A1 * | 3/2006 |

* cited by examiner

*Primary Examiner* — Jennifer McNeil
*Assistant Examiner* — Adam Krupicka
(74) *Attorney, Agent, or Firm* — McDermott Will & Emery LLP

(57) ABSTRACT

To provide a solder alloy, a solder ball and an electronic member having a solder bump, used for connection with a mother board or the like, having a melting temperature of less than 250° C. for the solder alloy, achieving high drop impact resistance required in mobile devices or the like. A solder alloy is used which consists of not less than 0.1 mass ppm of boron and not greater than 200 mass ppm of boron and a remainder comprising substantially not less than 40% by mass of Sn, in which its melting temperature is less than 250° C.

10 Claims, No Drawings

SOLDER ALLOY, SOLDER BALL AND ELECTRONIC MEMBER HAVING SOLDER BUMP

CROSS REFERENCE TO PRIOR APPLICATIONS

The present application claims priority under U.S.C. §119 to Japanese Patent Application No. 2008-278877, filed Oct. 29, 2008. The content of the application is incorporated herein by reference in its entirety.

TECHNICAL FIELD

The present invention relates to a solder alloy to be used for connecting electronic parts, a solder ball, and an electronic member having a solder bump.

BACKGROUND ART

In an electronic circuit board embedded in an electronic device, soldering is used to connect electronic parts to the board. Among welding methods for joining metals, soldering is a kind of brazing and soldering which welds metals by using a brazing metal whose melting point is lower than a base (parent) metal, utilizing a wetting phenomenon in which no melting of the base metal occurs. An alloy, out of metals to be used as the brazing metal, having a melting point of less than 450° C., in particular, is called "solder". In general, the melting temperature of solder used for outer connection of electronic devices such as a resistor, capacitor and diode or of a semiconductor package, and for secondary mounting of a flip chip package or the like is less than 250° C. at the highest and the soldering in these steps is performed by a flow or reflow method, hand soldering method, or the like. Here, in the case of pure metal, eutectic alloy, and compound, the melting temperature represents the melting point thereof and, in the case of an alloy having two or more phases, the melting temperature represents the liquidus-line temperature thereof. On the other hand, the solder used mainly for primary mounting in the inner portion of a semiconductor package is called "high-temperature solder" which does not melt at the flow or reflow temperature (about 260° C.). Soldered portions in the above cases are loaded with thermal fatigue caused by a temperature rise or drop occurring at the time of on/off operations of devices and, therefore, thermal fatigue property is used conventionally and generally as an index of connection reliability in the soldered portion. Moreover, in the application of the soldering process to the mobile device recently typified by a mobile phone, such a property is required that the soldered portion of the mobile device can withstand the drop impact that occurs when the mobile device is dropped. As a result, a new index of connection reliability such as drop impact resistance in the soldered portion has become necessary.

Conventionally, as a material for a solder alloy, components comprising tin (Sn) and lead (Pb) have been widely used. However, in order to meet the environment requirements in recent year to comply with the RoHS (Restriction of the Use of Certain Hazardous Substances in Electrical and Electronic Equipment) instructions in the EU (European Union), a lead-free solder comprising no Pb has been widely developed and practically used. As a lead-free solder material, an Sn—Ag—Cu alloy is now one of promising candidate materials (see Japanese Patent Application Laid-open No. Hei 5-50286 ("JP '286")). In the electronic parts mounting processes, the lead-free materials such as Sn-3.0 Ag-0.5 Cu and Sn-4.0 Ag-0.5 Cu alloys are being used normally.

In recent years, as high-density mounting of electronic parts progresses, areas of electrode pads on the board are being reduced rapidly and, therefore, it is necessary to decrease the amount of solder to be used at a weld, thus causing a further increase in a load imposed on the soldered portion where not only lead solder but also the lead-free solder is used. In the soldered portion, in particular, where outer connection of a semiconductor package is made or parts such as a resistor, capacitor and diode are connected on a mother board, a requirement is becoming large that additional connection reliability represented as drop impact resistance has to be satisfied. In order to solve these problems, by adding various elements, an attempt to improve connection reliability in the soldered portion has been studied.

A lead-free solder alloy is disclosed in Japanese Patent Application Laid-open No. 2002-239780 ("JP '780") which has a silver (Ag) content being lower than that of the normal lead-free solder described above and provides an excellent drop impact resistance when a specified amount of Ag is contained. That is, the lead-free solder alloy contains 1.0 to 2.0% by mass of Ag, 0.3 to 1.5% by mass of copper (Cu), a remainder of Sn and unavoidable impurities. This enables the excellent thermal fatigue resistance and impact resistance to be provided to the lead-free solder. Further, it is disclosed in the Patent Document 2 that, by adding, by mass %, 0.05 to 1.5 nickel (Ni) or 0.005 to 0.5 iron (Fe), strength of a solder alloy can be enhanced.

Also, in Japanese Patent Application Laid-open No. 2005-319470 ("JP '470"), a lead-free solder is disclosed which is obtained by allowing an Sn—Ag—Cu lead-free solder to contain fine particles having an element that does not substantially melt in the solder. This enables a structure of the solder to be made finer and its mechanical strength and its thermal impact resistance to be improved. Examples of the element that is contained in the fine particle and does not melt in the solder include boron (B), aluminum (Al), Ti, vanadium (V), chromium (Cr), manganese (Mn), Fe, cobalt (Co), Ni, zirconium (Zr), niobium (Nb), and molybdenum (Mo).

It is also disclosed in Japanese Patent Application Laid-open No. 2006-159266 ("JP '266") that solder joint stability is improved by adding silicon (Si) and B to a high-temperature Sn—Sb—Ag—Cu solder having a melting temperature of 250° C. or more. It is also reported that the addition of the above elements suppresses the enlargement of an antimony (Sb) crystal and affinity occurs among metals at the time of melting, which prevents aggregation of metal, thus suppressing the occurrence of void.

As described above, as the high-density mounting of electronic parts progresses and mobile electronic devices become highly functional, demands for reliability in the soldered portion and for excellent drop impact resistance increase and, therefore, there is a problem that sufficient performance may not be expected from the conventional solder alloy. Particularly, as for solder alloys used for outer connection of semiconductor packages or for connection between a resistor, capacitor, diode, or the like and a mother board, the performance thereof has not been satisfactory.

Generally, in the soldering for the primary mounting (high temperature soldering) used for connection of a semiconductor package using flip chip bonding, a portion surrounding the soldered place is filled with a sealing resin. On the other hand, the soldered portion on the secondary connection (secondary mounting) side and the soldering portion where a resistor, capacitor, diode, or the like are joined to the mother board is not always filled with the resin. Therefore, in these portions not filled with the resin, it is required that the solder itself exhibits high connection reliability.

In the solder disclosed in the JP '286, its thermal fatigue property has been improved in response to the conventional demand for better performance in the soldered portion and, as a result, the drop impact resistance required for the application to mobile devices is not taken into consideration.

In the solder disclosed in the JP '780, the Ag content is reduced so as to be kept within a specified range, whereby the solder is allowed to have ductility to thereby improve its drop impact resistance. However, in the case of the disclosed solder, interfacial strength between the solder and board electrode is not sufficient, thus leading to fine pitch and, therefore, when an area and volume of the soldered portion are reduced, high drop impact resistance is not always exhibited to satisfy the requirements for solder joint on the secondary side.

In the solder disclosed in the JP '470, it is reported that the structure of the soldered portion is made finer due to the existence of fine particles of refractory elements, which can suppress crack progress, thus improving the drop impact resistance. However, there is no description about the drop impact resistance required in the case of application to the mobile devices. At the time of the occurrence of drop impact, the interfacial strength between the solder and board electrode becomes a main important factor. Nevertheless, the JP '470 only discloses such that a thickness of intermetallic compound formed between the solder and board electrode is reduced to thereby improve connection reliability therebetween. It is not considered, however, that the thickness of the intermetallic compound is the only factor to achieve excellent drop impact resistance.

In the JP '266, the solder alloy is disclosed that has improved solder joint stability by adding trace quantities of Si and B. However, generally, it is necessary that the solder used for the primary mounting of a semiconductor package using flip chip bonding has its melting temperature of 250° C. or more and, therefore, the solder disclosed in the JP '266 is not allowed to be used for the secondary mounting or for the connection with the mother board or the like. Moreover, in the primary mounting in the semiconductor package, the surrounding portion of the soldered place is filled with the sealing resin, necessity of considering the drop impact resistance is low and, therefore, in the JP '266, there is neither description nor suggestion about the drop impact resistance required for the application to mobile devices.

The present invention has been made in light of the problems described above and has an object to provide a solder alloy, a solder ball and an electronic member having solder bump that are to be used for connection with a mother board or the like, having a high drop impact resistance required in the application to mobile devices or the like and has a melting temperature of less than 250° C.

SUMMARY OF THE INVENTION

The inventors of the present invention have focused attentions on intermetallic compounds formed between solder and an electrode to improve drop impact resistance of a solder alloy having a melting temperature of less than 250° C. to be used for connecting electronic parts to mother boards or the like. In the conventional solder, in general, when a load such as drop impact is imposed onto the interface between solder and the electrode, brittle failure occurs due to insufficient drop impact resistance. The inventors have made researches of the drop impact resistance of solder and characteristics of intermetallic compounds at the interface between the solder and electrode by adding various elements to the solder. As a result, it has been found that, by adding a specified amount of B to the solder to be used for connecting electronic parts to the mother board or the like, breaking strength at the interface of the solder and electrode is enhanced and drop impact resistance is dramatically improved compared with the conventional solder. These researches have led to the present invention, the subject matters of which are as follows:

In order to achieve the above objects, the solder alloy stated in an aspect of the present invention is characterized by consisting of not less than 0.1 mass ppm and not greater than 200 mass ppm of B and a remainder comprising substantially not less than 40% by mass of Sn, wherein the alloy has a melting temperature of being less than 250° C.

Also, the solder alloy stated in another aspect of the present invention is characterized in that the B of the first aspect is added by using a boron-containing substance and the boron-containing substance is at least one out of a solid solution, eutectic, and compound.

Also, the solder alloy stated in a further aspect of the present invention is characterized in that the boron-containing substance of the above aspect is any one of a copper-boron solid solution, copper-boron eutectic, nickel-boron solid solution, nickel-boron eutectic, and nickel-boron compound.

Also, the solder alloy stated in an aspect of the present invention is characterized in that the solder alloy of the above aspects contains Ag and Cu, wherein a content of the Ag is not less than 0.1% by mass and not greater than 5% by mass and a content of the Cu is not less than 0.01% by mass and not greater than 1.5% by mass.

Also, the solder alloy stated in further aspects of the present invention is characterized in that the solder alloy of the above aspects contains Ag, Cu, and Ni, wherein a content of the Ag is not less than 0.8% by mass and not greater than 1.5% by mass, a content of the Cu is not less than 0.05% by mass and not greater than 1.0% by mass and a content of the Ni is not less than 0.01% by mass and not greater than 0.1% by mass.

Also, the solder alloy stated in an aspect of the present invention is characterized in that the solder alloy of the above aspects contains at least one of P, germanium (Ge), and gallium (Ga), wherein a content of the P is not greater than 0.05% by mass, a content of the Ge is not greater than 0.05% by mass, and a content of the Ga is not greater than 0.05% by mass.

Also, the solder alloy stated in another aspect of the present invention is characterized in that the solder alloy of the above aspects contains Sb, wherein a content of the Sb is not less than 0.005% by mass and not greater than 1.0% by mass.

Also, the solder alloy stated in further aspect of the present invention is characterized in that the solder alloy of the above aspects contains Pb, wherein a content of the Pb is not greater than 0.1% by mass.

Also, the solder ball stated in an aspect of the present invention is characterized by being made of the solder alloy of the above aspects, wherein its spherical diameter is not greater than 1 mm.

Also, the electronic member stated in an aspect of the present invention is characterized by having a solder bump formed using the solder alloy of the above aspects.

Also, the electronic member stated in a further aspect of the present invention is characterized by having a solder bump formed using the solder ball of the above aspects.

Also, the solder ball stated in another aspect of the present invention is characterized by including substantially not less than 40% by mass of Sn and having its melting temperature of less than 250° C. and its surface is coated with a boron-containing layer.

Also, the solder ball of the present invention is characterized in that a content of the B contained in the boron-containing layer of the above aspects is not less than 0.1 ppm and not greater than 200 ppm with respect a total mass of the solder ball.

Also, the solder ball of the present invention is characterized in that the solder ball of the above aspects include Ag and Cu, wherein a content of the Ag is not less than 0.1% by mass and not greater than 5% by mass and a content of the Cu is not less than 0.01% by mass and not greater than 1.5% by mass.

Also, the solder ball of the present invention is characterized in that the spherical diameter of the solder ball of the above aspects is not greater than 1 mm.

Also, the electronic member stated in a further aspect of the present invention is characterized by having a solder bump formed using the solder ball of the above aspects.

Also, the electronic member of the present invention is characterized by having a solder bump including substantially not less than 40% by mass of Sn and having its melting temperature of less than 250° C., wherein B is concentrated in a region of at least up to 5 μm from an interface between the solder bump and an electrode at both sides thereof.

Furthermore, the electronic member stated in another aspect of the present invention is characterized in that content of the B of the above aspects is concentrated up to 0.5 mass ppm or above in the region.

According to the solder alloy of the present invention which is to be used for connection of electronic parts with a mother board or the like and has a melting temperature of less than 250° C., the drop impact resistance in the soldered portion, drop impact resistance required in the mobile devices, in particular, can be remarkably improved.

DETAILED DESCRIPTION OF THE INVENTION

It has been found in the present invention that, by using a solder bump comprising substantially not less than 40% by mass of Sn and having its melting temperature of less than 250° C. and by allowing the content of B to be concentrated in a region of at least up to 5 μm from an interface between the solder bump and an electrode at both sides thereof, interfacial breaking strength of an intermetallic compound formed in the soldering portion can be greatly enhanced and drop impact resistance can be remarkably improved. In order to concentrate the B content in the region of at least up to 5 μm from an interface between the solder bump and an electrode at both sides thereof, there are some ways available, which include using a solder alloy comprising B; using a solder alloy the surface of which is coated with a layer comprising B; and forming a boron-containing layer on a surface of the electrode. Hereinafter, the configuration and mechanism of each of them are described in sequence.

In the Case of Using Solder Alloy Comprising B

It has been found in the present invention that, by using the solder alloy consisting of not less than 0.1 mass ppm and not greater than 200 mass ppm of B and a remainder containing substantially not less than 40% by mass of Sn and having its melting temperature of less than 250° C. in the soldered portion where connection is made with the mother board or the like, interfacial breaking strength of an intermetallic compound formed in the soldering portion can be greatly enhanced and drop impact resistance can be remarkably improved. Here, in the case of pure metal, eutectic alloy, and compound, the melting temperature represents the melting point thereof and, in the case of an alloy having two or more phases, the melting temperature represents the liquidus-line temperature thereof. Hereinafter, details about great improvements of the drop impact resistance obtained by letting the above content of B be contained in the solder alloy comprising not less than 40% by mass of Sn are described.

As described above, in spite of reduced amounts of solder that is allowed to be used in the soldered portion, not only the solder joint reliability having been conventionally required but also additional new solder joint reliability such as drop impact resistance is required. In recent years, the JESD22-B111 test standard regulated by the JEDEC (Joint Electron Device Engineering Council) being a sub-alliance of the EIA (Electronic Industries Alliance) has come now to be normally used as standard for evaluation of drop impact resistance. By evaluating the drop impact resistance using Sn-3 Ag-0.5 Cu having been widely and substantially used as a standard component of lead-free solder, it has turned out that brittle failure occurs in intermetallic compounds formed between an electrode and solder bump, thus causing the drop impact resistance to be remarkably degraded. The inventors of the present invention have focused attention on the breaking strength occurring in intermetallic compounds and have made a search for an alloy component that can enhance the breaking strength and have found that, by adding a specified amount of B, the breaking strength in the intermetallic compounds can be greatly enhanced. As a result, the drop impact resistance in the soldered portion has been dramatically improved. The mechanism of the occurrence of such a function as above is still being studied, however, it can be now considered as follows. That is, it is known that, in a polycrystal of an $Ni_3Al$ intermetallic compound, boron segregates in grain boundaries due to small atomic radius thereof, which enhances Ni—Ni interatomic force and, as a result, fracture toughness is dramatically improved. On the other hand, on the board having a surface treatment electrode made of Cu/Ni/Au obtained by plating a Cu electrode, which is used widely as a printing board, with Ni and Au, an Ni—Sn intermetallic compound is formed between a solder bump and an electrode. Boron is considered to be liable to segregation in grain boundaries of not only the $Ni_3Al$ intermetallic compound but also the Ni—Sn intermetallic compound and the segregated boron improves bonding force among atoms and, as a result, it is considered that breaking strength of the Ni—Sn intermetallic compound is enhanced by the addition of B. Even in the case of the board made of a Cu electrode not plated with Ni and Au (including a board made of the Cu electrode coated with an organic protection film), boron segregates in grain boundaries of a $Cu_6Sn_5$ intermetallic compound formed between a solder bump and electrode, thus enhancing interfacial strength of the intermetallic compound by the same action as above. As described above, the boron contained in the solder alloy causes selective oxidation or evaporation when the melting temperature becomes high which foils the effect expected by the B, however, at the melting temperature of less than 250° C. in which the solder alloy can be used, the contained boron acts effectively on the enhancement of the breaking strength. Moreover, irrespective of whether the solder to be used is a lead solder or a lead-free solder, so long as the solder having its melting temperature of less than 250° C. and being an Sn-based solder is employed, in any case where the solder is used, the addition of B acts effectively on the enhancement of the breaking strength of an intermetallic compound formed in an interface between a solder and electrode and, therefore, is effective in the soldered portion to be used for connection with a mother board or the like requiring a high drop impact resistance. The drop impact resistance of the lead-free solder is inferior to that of the lead solder and, therefore, in the case of the example of the present invention, the addition of B is more remarkably effective in improving the breaking strength. Hereinafter, a preferable range of contents of B, limiting reason imposed on the addition and the like are described.

As described above, the added B is effective in enhancing the breaking strength and, therefore, the addition of B of the present invention is applied to the solder alloy comprising not less than 40 by % by mass of Sn and, for the reasons described above, the added B acts effectively on the solder alloy having its melting temperature of less than 250° C. and is effective particularly in the solder to be used to mount electronic parts such as a semiconductor package, resistor, capacitor, and the like on a printing board. Especially, when the melting temperature is not greater than 240° C., more remarkable effect of the addition of B can be obtained. According to the present invention, the specified examples of alloy components to which the addition of B can be effectively applied are components being generally used including SnAgCu, SnAg, SnCu, SnZn, SnBi, SnZn, SnIn, SnPb and the like. The content of B is not less than 0.1 ppm and not greater than 200 ppm. If the content of B is less than 0.1 ppm, the amount of B being segregated in grain boundaries of an intermetallic compound is too small and, as a result, the enhancement of breaking strength is not recognized. Moreover, the upper limit of the B content is set to be 200 ppm since, if the B content exceeds 200 ppm, the size of a cluster being segregated in the grain boundaries of the intermetallic compound becomes too big and, as a result, an increase in bonding force at the interface is adversely influenced. The B content is preferably not less than 0.1 ppm and not greater than 100 ppm, more preferably not less than 0.1 ppm and not greater than 50 ppm.

Further, B is added as a single body thereof or as a substance comprising B. By using the substance comprising B in the form of a solid solution, eutectic, or compound, breaking strength in the intermetallic compound to be formed between a solder bump and electrode can be enhanced and the present invention is more effectively carried out and, as a result, drop impact resistance can be further improved. The example of the boron-containing substance includes Cu—B, Ni—B, Fe—B, Si—B Cr—B, Zr—B, Co—B and the like. Here, the solid solution stands for a state of an alloy in which different substances are uniformly melted in a solid phase. The eutectic stands for a mixture of two kinds or more crystals that are simultaneously crystallized from a liquid comprising two or more components. The compound stands for a pure substance made of two or more elements. The mechanism of the effect obtained by the addition of B is not yet clarified, however, it can be thought that, by letting B be dissolved from the boron-containing substance, an appropriate amount of B can be uniformly added in the solder, which promotes the concentration of B in the Ni—Sn intermetallic compound or Cu—Sn intermetallic compound formed in an interface between the solder and electrode and which, as a result, leads to the more effective enhancement of the breaking strength of the intermetallic compound. Among the boron-containing substances described above, Cu—B solid solution alloy, Ni—B compound alloy, Si—B solid solution alloy, in particular, can be more suitably used. By using the Cu—B solid solution alloy, Ni—B compound alloy, and Si—B solid solution alloy, affinity to an electrode interface such as a board having a Cu electrode or Cu/Ni/Au is increased whereby the concentration of B in the intermetallic compound progresses, thus achieving remarkable enhancement of breaking strength.

The B contained in the alloy can be analyzed by the ICP (Inductively Coupled Plasma spectrometer) method, GD-MS (Glow Discharge-Mass spectrometer) method, or the like to determine the B content.

When the boron described above is added to SnAgCu being used as a standard lead-free solder which contains not less than 0.1% by mass and not greater than 5% by mass of Ag and not less than 0.01% by mass and not greater than 1.5% by mass of Cu, the improvement of the drop impact resistance is made remarkable and other solder joint reliability properties of solder such as thermal fatigue property or wetting property of solder become excellent. If the above SnAgCu solder contains less than 0.1% by mass of Ag, the thermal fatigue property is degraded in some cases. If the above solder contains more than 5% by mass of Ag, coarse and large $Ag_3Sn$ is formed in the solder and, as a result, solder joint reliability is decreased in some cases. More preferably, the above solder contains not less than 0.8% by mass and not greater than 1.5% by mass of Ag. If the above solder contains less than 0.01% by mass of Cu, wetting property of solder is degraded in some cases. If the above solder contains more than 1.5% by mass of Cu, the solder becomes rigid and solder joint reliability is degraded in some cases. More preferably, the above solder contains not less than 0.05 and not greater than 1.0% by mass of Cu.

By letting Ni exist in the Sn, the effect of suppressing the growth of the intermetallic compound formed between the solder and electrode can be obtained. As a result, in synergy with the effect of adding B, the solder joint reliability represented by the drop impact resistance is remarkably improved. Especially, if the Ni content is not less than 0.005% by mass and not greater than 0.5% by mass, the above synergy effect becomes great. If the Ni content is less than 0.005% by mass, the above synergy effect does not occur in some cases. If the Ni content is more than 0.5% by mass, the solder becomes rigid and the solder joint reliability is degraded in some cases. More preferably, the Ni content is not less than 0.01% by mass and not greater than 0.1% by mass.

By letting P, Ge, and Ga exist in the Sn, the effect of reducing oxidized inclusion contained in the Sn can be obtained. The existence of the oxidized inclusion near to the interface causes extreme degradation of its interfacial characteristics. According to the present invention, by adding at least one of P, Ge, and Ga at the same time when B is added, in synergy with the effect of the B addition, the solder joint reliability represented by the drop impact resistance is remarkably improved. Especially, the synergy effect is large when the P content is not greater than 0.05% by mass, Ge content is not greater than 0.05% by mass, and Ga content is not greater than 0.05% by mass. When any one of the elements P, Ge, and Ga being more than 0.05% by mass is contained, the drop impact resistance is degraded. Moreover, these elements can prevent the color change of solder.

By letting Sb exist in the Sn, the Sb is made to disperse within the Sn and the effect of improving crack propagation resistance in the solder can be obtained. Especially, simultaneous addition of B and Sb decreases the crack propagation rate of the solder. As a result, not only the drop impact resistance but also thermal fatigue property are improved. When the Sb content is not less than 0.005% by mass and not greater than 1.0% by mass, the above synergy effect obtained by the addition of both B and Sb becomes large. In the case of the Sn content being less than 0.005% by mass, the synergy effect is difficult to occur in some cases. Moreover, in the case of the Sn content being more than 1.0% by mass, the solder become rigid, resulting in a decrease of solder joint reliability. The Sn content is preferably not less than 0.02% by mass and not greater than 0.5% by mass.

Generally, the composition of the above elements is measured by the ICP method, GD-MS method, or the like to determine the content of the elements.

The effect of the boron addition in the present invention is not influenced by presence or absence of Pb, however, in a low-ductility lead-free solder being more rigid than an Sn—Pb alloy, remarkable improvement of the drop impact resistance is obtained and, especially, in a lead-free solder having the Pb content being not greater than 0.1% by mass, the drop impact resistance is more effectively improved.

The effect of the solder alloy found in the present invention also can be allowed to appear in any type of solder alloy including flow solder, reflow solder, thread solder, and the like and also in cream solder containing solder powder or a solder ball. Especially, the solder alloy of the present invention can be suitably used in a solder ball having a spherical diameter of not greater than 1 mm which is applied to fine diameter connection for packages. Therefore, the electronic member having a solder bump made of the solder alloy can enhance the breaking strength of an intermetallic compound and, as a result, can be provided as an electronic member being excellent in the drop impact resistance.

The solder alloy can be produced in a vacuum atmosphere, in a non-oxidizing atmosphere or the like and the alloy produced in any atmosphere can provide the effect of the present invention. By heating and melting a solder-based alloy or each component of the solder-based alloys in the above atmosphere and by adding B and mixing, and then by cooling and solidifying the mixture, the solder alloy of the present invention can be produced. Also, by adding, in advance, B to the solder-based alloy or each component of the solder-based alloys and by heating and melting the mixture in the above atmosphere and then cooling and solidifying the mixture, the solder alloy of the present invention can be produced. The solder-based alloy that can be used in the present invention includes, for example, SnAgCu, SnAg, SnCu, SnZn, SnBi, SnZn, SnIn, SnPb alloys and the like. Further, B is added as a single body thereof or as a substance comprising B. The substance comprising B can be used in the form of a solid solution, eutectic, or compound. The solder alloy produced by the above methods can provide more excellent effects of the present invention. As the B-containing substance to be used for the addition of boron, for example, a solid solution, eutectic, compound of Cu—B, Ni—B, Fe—B, Si—B, Cr—B, Zr—B, Co—B, and the like can be employed. Moreover, other metals that can be added in the present invention may be added before or after the addition of B or at the same time when B is added.

Further, in order to produce a solder ball from the solder alloy, any one may be used out of methods including a wire cutting method in which the melt solder alloy ingot is drawn and, after making the drawn ingot be of wire-shaped, the wire-shaped alloy is cut to a specified length and the cut alloy is allowed to melt in oil and the melted alloy is allowed to be spherical-shaped by using surface tension, an in-air granulation method in which melted solder is jetted through a fine diameter orifice by vibration and the melted solder is cut by waves generated by vibration in a vacuum atmosphere or in a gas atmosphere or the like.

In the present invention, to produce the solder bump by using a solder alloy, two methods are available in general, one being a screen printing method and another is a solder ball method. In the screen printing method, after producing solder powder from the above solder alloy by an atomization method, paste is produced by mixing the solder powder with flux and then the paste is squeezed through the hole of a metal mask on the electrode and then a specified amount of paste is put on the electrode and the paste is re-flown to produce the solder bump. In the solder ball method, the solder balls are arranged on the electrode coated with flux and then the solder balls are re-flown to form the solder bump.

In the Case of Using a Solder Alloy the Surface of which is Coated with a B-Containing Layer and in the Case of Forming a B-Comprising Substance on the Electrode Surface The effect of the present invention obtained by boron concentration phenomenon occurring on the vicinity region centered on the interface between the solder bump and an electrode is to achieve the enhancement of breaking strength of an intermetallic compound formed between the solder and electrode. The Sn content of the solder ball being one of objects of the present invention is not less than 40% by mass and the effect of the present invention appears in the solder ball having its melting temperature of less than 250° C. and the solder ball is suitably employed as solder to be effectively used for mounting electronic parts such as a semiconductor package, resistor, capacitor on a printed circuit being connected thereto. Especially, more remarkable effect manifests itself when the melting temperature is not greater than 240° C. The compound of the solder alloy usable and effective in the present invention includes, for example, SnAgCu, SnAg, SnCu, SnZn, SnBi, SnIn, SnPb or the like which are compounds being normally used for the solder alloy.

The concentration of B is preferably not less than 0.5 mass ppm in the region of at least up to 5 μm from an interface between the solder bump and an electrode at its both sides. If the B concentration is less than 0.5 mass ppm, the amount of boron segregated in the grain boundaries of the compound is small and, therefore, the enhancement of breaking strength can not be recognized.

To allow the B concentration to be not less than 0.5 mass ppm in the upward and downward region being at least 5 μm from an interface between the solder bump and an electrode at its both sides, it is preferable that the B content of the solder ball be not less than 0.1 mass ppm and not greater than 200 mass ppm. If the B concentration is less than 0.1 mass ppm, the amount of B segregated in the grain boundaries of the intermetallic compound is small and, therefore, the enhancement of breaking strength cannot be recognized. If the B concentration exceeds 200 mass ppm, the size of a cluster being segregated in the grain boundaries of the intermetallic compound becomes too large, which adversely influences the increase in bonding strength at the interface and, therefore, the upper limit of the B concentration is determined to be 200 mass ppm. The B concentration is more preferably not less than 0.1 mass ppm and not greater than 100 ppm, more preferably not less than 0.1 mass ppm and not greater than 50 mass ppm.

The B contained in the solder can be analyzed by the ICP method, GD-MS method, or the like to determine the content of B.

In the case of SnAgCu solder being normally used as a component of a lead-free solder, when its Ag content is not less than 0.1% by mass and not greater than 5% by mass and its Cu content is not less than 0.01 and not greater than 1.5% by mass, the drop impact resistance is remarkably improved owing to boron concentration phenomenon occurring on the vicinity region centered on the interface between the solder bump and the electrode and other excellent solder joint reliability properties such as thermal fatigue property of the solder and/or wetting property of the solder is provided. If the Ag content of the component is less than 0.1% by mass, the thermal fatigue property is unfavorably degraded in some cases. If the Ag content exceeds 5% by mass, coarse and large Ag₃Sn is formed in the solder, causing degradation of the solder joint reliability in some cases. More preferably, the Ag content is not less than 0.8% by mass and not greater than 1.5% by mass. If the Cu content is less than 0.01% by mass, the wetting property of the solder is degraded in some cases. If the Cu content exceeds 1.5% by mass, the solder becomes rigid, causing the degradation of solder joint reliability in some cases. More preferably, the Cu content is not less than 0.05% by mass and not greater than 1.0% by mass.

Generally, the above element can be measured by the ICP method, GD-MS method, or the like to determine the content thereof.

Especially, the solder ball of the present invention can be suitably used in a solder ball having a spherical diameter of not greater than 1 mm which is applied to fine diameter connection for packages. Therefore, in an electronic member having a solder bump formed by using the above solder ball, breaking strength of an intermetallic compound can be enhanced, which enables the electronic member being excellent in the drop impact resistance to be provided.

To make the boron concentration phenomenon occur in the upward and downward region being at least 5 μm from both sides centered on the interface between the solder bump and electrode, two methods are available, one being the method of using a solder ball the surface of which is coated with a boron-containing layer and another being the method of forming a boron-containing layer on the surface of an electrode.

The solder ball the surface of which is coated with the boron-containing layer can be formed by plating or painting. In the case of the formation by plating, a solder ball is soaked in a plating liquid comprising B to form the boron-containing layer on its surface. In the case of the formation by painting, a solder ball is soaked in a solution obtained by dissolving the boron-containing compound in an organic solvent to form the B-containing layer on its surface.

Also, by soaking an electrode in a plating liquid comprising B, the boron-containing layer is formed on the surface of the electrode.

Moreover, the solder-based alloy includes, for example, SnAgCu, SnAg, SnCu, SnZn, SnBi, SnZn, SnIn, SnPb, and the like.

Further, in order to produce a solder ball from the solder alloy, any one may be used out of methods including a wire cutting method in which the melt solder alloy ingot is drawn and, after making the drawn ingot be of wire-shaped, the wire-shaped alloy is cut to a specified length and the cut alloy is made to melt in oil and the melted alloy is made to be spherical-shaped by using surface tension, an in-air granulation method in which melted solder is jetted through a fine diameter orifice by vibration and the melted solder is cut by waves generated by vibration in a vacuum atmosphere or in a gas atmosphere or the like.

In the present invention, the solder bump may be formed by using a solder ball. In the solder ball method, the solder balls are arranged on the electrode coated with flux and then the solder balls are re-flown to form the solder bump.

Hereinafter, effects to be obtained by the present invention are described specifically by referring to the examples described below.

EXAMPLES

In the Case of Using a Solder Alloy Comprising Boron

Example 1

Each of solder alloys was produced, after weighing each pure metal, by a high-frequency melting method using an alumina crucible so that each solder alloy has composition as shown in Table 1. Here, boron was added by producing metal boron as single body of B from a boron material and by simultaneously melting each pure metal and metal boron. The analysis on the composition of the produced solder alloy was performed by the ICP method and GD-MS method. By performing wire drawing process on each of the produced solder alloys, wires were produced and a solder ball being 300 μm in diameter is formed by the wire cutting method. As a sample part on which the solder ball is mounted, an 84-pad CSP (Chip-Scale-Package) with a pitch being 0.5 mm square was used. For surface treatment of the electrode of the CSP, Cu/Ni/Au obtained by plating a Cu electrode with Ni and Au was used. As a board on the mother board side, the board being 132×77×1 (mm) in size the surface of which was treated with Cu/Ni/Au was employed. First, a solder ball is put on the CSP and reflowing process is performed thereon and, after bumps were formed thereon, the CSP was mounted on the printed board. A water-soluble flux was used. A temperature profile was such that the reflowing process was performed under a condition at a melting temperature plus 30° C. and a substance having composition comprising B was re-flown at the same temperature as a substance having composition not comprising B. The drop impact resistance was evaluated according to the JESD22-B111 test standard regulated by the JEDEC in which a resistance value of each part was monitored for every drop and the number of times of drops occurring when the resistance value has become twice its initial value was defined as failure. The solder alloy whose drop impact resistance was equal to or lower than that of the solder alloy (having the same composition) to which boron was not added was expressed by a symbol of x. The solder alloy whose drop impact resistance was by 20% higher than that of the solder alloy to which boron was not added was expressed by a symbol of ○. The solder alloy whose drop impact resistance was by 30% higher than that of the solder alloy to which boron was not added was expressed by a symbol of ◎. The solder alloy whose drop impact resistance was by 40% higher than that of the solder alloy to which boron was not added was expressed by a symbol of ◎○. The results from the evaluation were shown in Table 1.

In the solder alloy having its melting temperature being not less than 250° C. (No. 1-1 to No. 1-4), the effect of the boron addition was not obtained, however, in the solder alloy having its melting temperature being less than 250° C. and its B content is not less than 0.1 ppm and not greater than 200 ppm and a remainder substantially being not less than 40% by mass of Sn, the remarkable improvement of the drop impact resistance was obtained. (No. 1-6, No. 1-8, No. 1-11 to 1-20, No. 1-23, No. 1-25, No. 1-27, No. 1-30 to No. 1-39, No. 1-42, No. 1-44, No. 1-46, and No. 1-48). Especially, in the solder alloy having the B content of not less than 0.1 ppm and not greater than 100 ppm, the excellent drop impact resistance was observed. (No. 1-6, No. 1-8, No. 1-11 to No. 1-17, No. 1-23, No. 1-25, No. 1-27, No. 1-30 to No. 1-36, No. 1-42, No. 1-44, No. 1-46, and No. 1-48). In the solder alloy having its B content being not less than 0.1 ppm and not greater than 50 ppm, more excellent drop impact resistance was obtained. (No. 1-6, No. 1-8, No. 1-11 to No. 1-15, No. 1-23, No. 1-25, No. 1-27, No. 1-30 to No. 1-34, No. 1-42, No. 1-44, No. 1-46, and No. 1-48). In addition, in the solder alloy having its content being less than 0.1 ppm or exceeds 200 ppm, no improvement of the drop impact resistance was found (No. 1-5, No. 1-7, No. 1-9, No. 1-10, No. 1-21, No. 1-22, No. 1-24, No. 1-26, No. 1-28, No. 1-29, No. 1-40, No. 1-41, No. 1-43, No. 1-45 and No. 1-47).

TABLE 1

| NO. | COMPOSITION (MASS %) OF SOLDER ALLOY | B CONTENT (MASS ppm) | MELTING TEMPERATURE (° C.) | DROP IMPACT RESISTANCE | REMARKS |
|---|---|---|---|---|---|
| 1-1 | Pb—5Sn | 0 | 314 | X | COMPARATIVE EXAMPLE |
| 1-2 | | 25 | | X | COMPARATIVE EXAMPLE |
| 1-3 | Sn—7Sb | 0 | 250 | X | COMPARATIVE EXAMPLE |
| 1-4 | | 25 | | X | COMPARATIVE EXAMPLE |
| 1-5 | Sn—5Sb | 0 | 241 | X | COMPARATIVE EXAMPLE |
| 1-6 | | 25 | | ◎ | EXAMPLE |
| 1-7 | Sn | 0 | 232 | X | COMPARATIVE EXAMPLE |
| 1-8 | | 25 | | ◎○ | EXAMPLE |
| 1-9 | Sn—0.7Cu—.3Ag | 0 | 226 | X | COMPARATIVE EXAMPLE |
| 1-10 | | 0.05 | | X | COMPARATIVE EXAMPLE |
| 1-11 | | 0.1 | | ◎○ | EXAMPLE |
| 1-12 | | 0.5 | | ◎○ | EXAMPLE |
| 1-13 | | 1 | | ◎○ | EXAMPLE |
| 1-14 | | 25 | | ◎○ | EXAMPLE |
| 1-15 | | 50 | | ◎○ | EXAMPLE |
| 1-16 | | 60 | | ◎ | EXAMPLE |
| 1-17 | | 100 | | ◎ | EXAMPLE |
| 1-18 | | 120 | | ○ | EXAMPLE |
| 1-19 | | 180 | | ○ | EXAMPLE |
| 1-20 | | 200 | | ○ | EXAMPLE |
| 1-21 | | 220 | | X | COMPARATIVE EXAMPLE |
| 1-22 | Sn—3Ag—0.5Cu | 0 | 219 | X | COMPARATIVE EXAMPLE |
| 1-23 | | 25 | | ◎○ | EXAMPLE |
| 1-24 | Sn—4Ag—0.5Cu | 0 | 219 | X | COMPARATIVE EXAMPLE |
| 1-25 | | 25 | | ◎○ | EXAMPLE |
| 1-26 | Sn—3.8Ag—0.7Cu | 0 | 217 | X | COMPARATIVE EXAMPLE |
| 1-27 | | 25 | | ◎○ | EXAMPLE |
| 1-28 | Sn—9Zn | 0 | 198 | X | COMPARATIVE EXAMPLE |
| 1-29 | | 0.05 | | X | COMPARATIVE EXAMPLE |
| 1-30 | | 0.1 | | ◎○ | EXAMPLE |
| 1-31 | | 0.5 | | ◎○ | EXAMPLE |
| 1-32 | | 1 | | ◎○ | EXAMPLE |
| 1-33 | | 25 | | ◎○ | EXAMPLE |
| 1-34 | | 50 | | ◎○ | EXAMPLE |
| 1-35 | | 60 | | ◎ | EXAMPLE |
| 1-36 | | 100 | | ◎ | EXAMPLE |
| 1-37 | | 120 | | ○ | EXAMPLE |
| 1-38 | | 180 | | ○ | EXAMPLE |
| 1-39 | | 200 | | ○ | EXAMPLE |
| 1-40 | | 220 | | X | COMPARATIVE EXAMPLE |
| 1-41 | Sn—8Zn—3Bi | 0 | 196 | X | COMPARATIVE EXAMPLE |
| 1-42 | | 25 | | ◎○ | EXAMPLE |
| 1-43 | Sn—37Pb | 0 | 183 | X | COMPARATIVE EXAMPLE |
| 1-44 | | 25 | | ◎○ | EXAMPLE |
| 1-45 | Sn—58Bi | 0 | 139 | X | COMPARATIVE EXAMPLE |
| 1-46 | | 25 | | ◎○ | EXAMPLE |
| 1-47 | Sn—52In | 0 | 119 | X | COMPARATIVE EXAMPLE |
| 1-48 | | 25 | | ◎○ | EXAMPLE |

Example 2

The solder alloy components were weighed so that the alloy has composition as shown in Tables 2, 3, and 4. In the example 2, the boron was added in the form of a single body of B or of boron-containing substance shown in the column of "B addition material" in the Tables 2, 3, and 4. The alloy serving as the material for the B addition was prepared by an arc melting method using metal boron and the pure metal described in the Table 2, and was added to the above solder alloy and adjusted so as to finally have the composition described in the Table 2. After that, the solder alloy was produced by the high-frequency melting method. The analysis on the composition of the produced alloys was performed by the ICP and GD-MS methods. Solder balls each having a diameter of 300 μm were produced by the in-air granulation method. The mounting and evaluation of the solder balls were performed in the same way as in the Example 1. The solder alloy whose drop impact resistance was equal to or lower than that of the solder alloy to which boron was not added was expressed by a symbol of x. The solder alloy whose drop impact resistance was by 15% higher than that of the solder alloy to which boron was not added was expressed by a symbol of ○. The solder alloy whose drop impact resistance was by 25% higher than that of the solder alloy to which boron was not added was expressed was expressed by a symbol of ◎. The solder alloy whose drop impact resistance was by 35% higher than that of the solder alloy to which boron was not added was expressed was expressed by a symbol of ◎○. The solder alloy whose drop impact resistance was by 45% higher than that of the solder alloy to which boron was not added was expressed by a symbol of ◎◎. The solder alloy whose drop impact resistance was by 55% higher than that of the solder alloy to which boron was not added was expressed by a symbol of ◎◎○. The results from the evaluation were shown in the Tables 2, 3, and 4. The drop impact resistance was more improved in the solder alloy comprising B added by using the boron single body, solid solution of B, eutectic of B, or compound of B (No. 2-13, No. 2-27, No. 2-41, No. 2-53, No. 2-55, No. 2-57, No. 2-59, No. 3-15 to No. 3-24, No. 3-27-No. 3-36, and No. 3-39 to No. 3-48) when compared with the solder alloy comprising B added by using the metal boron single body (No. 2-8, No. 2-22, No. 2-36, No. 2-52, No. 2-54, No. 2-56, No. 2-58, and No. 3-3 to No. 3-12). Especially, in the solder alloy comprising B added by using Cu—B solid solution or Ni—B compound, the high drop impact resistance was obtained (No. 2-27, No. 2-53, No. 2-55, and No. 2-57, No. 2-59, and No. 3-39 to No. 3-48). Moreover, in the solder alloy comprising B added by using both the Cu—B solid solution and the Ni—B compound, the more higher drop impact resistance was achieved (No. 4-15 to No. 4-25).

TABLE 2

| NO. | COMPOSITION (MASS %) OF SOLDER ALLOY | B CONTENT (MASS ppm) | MELTING TEMPERATURE (° C.) | DROP IMPACT RESISTANCE | BORON ADDITION MATERIAL | REMARKS |
|---|---|---|---|---|---|---|
| 2-1 | Sn—7Sb | 0 | 250 | X | NO-ADDITION | COMPARATIVE EXAMPLE |
| 2-2 | | 1 | | X | Cu—B SOLID SOLUTION | COMPARATIVE EXAMPLE |
| 2-3 | | 25 | | X | Ni—B COMPOUND | COMPARATIVE EXAMPLE |
| 2-4 | Sn—5.3Sb | 0 | 242 | X | NO-ADDITION | COMPARATIVE EXAMPLE |
| 2-5 | | 1 | | ◎ | Cu—B SOLID SOLUTION | EXAMPLE |
| 2-6 | | 25 | | ◎ | Ni—B COMPOUND | EXAMPLE |
| 2-7 | Sn—3Ag—0.5Cu | 0 | ~219 | X | NO-ADDITION | COMPARATIVE EXAMPLE |
| 2-8 | | 25 | | ◎○ | METAL BORON | EXAMPLE |
| 2-9 | | 0.05 | | X | Cu—B EUTECTIC | COMPARATIVE EXAMPLE |
| 2-10 | | 0.1 | | ◎◎ | Cu—B EUTECTIC | EXAMPLE |
| 2-11 | | 0.4 | | ◎◎ | Cu—B EUTECTIC | EXAMPLE |
| 2-12 | | 1 | | ◎◎ | Cu—B EUTECTIC | EXAMPLE |
| 2-13 | | 25 | | ◎◎ | Cu—B EUTECTIC | EXAMPLE |
| 2-14 | | 50 | | ◎◎ | Cu—B EUTECTIC | EXAMPLE |
| 2-15 | | 60 | | ◎○ | Cu—B EUTECTIC | EXAMPLE |
| 2-16 | | 100 | | ◎○ | Cu—B EUTECTIC | EXAMPLE |
| 2-17 | | 120 | | ◎ | Cu—B EUTECTIC | EXAMPLE |
| 2-18 | | 180 | | ◎ | Cu—B EUTECTIC | EXAMPLE |
| 2-19 | | 200 | | ◎ | Cu—B EUTECTIC | EXAMPLE |
| 2-20 | | 220 | | X | Cu—B EUTECTIC | COMPARATIVE EXAMPLE |
| 2-21 | Sn—1.5Ag—0.5Cu—0.5Ni | 0 | ~224 | X | NO-ADDITION | COMPARATIVE EXAMPLE |
| 2-22 | | 25 | | ◎○ | METAL BORON | EXAMPLE |
| 2-23 | | 0.05 | | X | Ni—B COMPOUND | COMPARATIVE EXAMPLE |
| 2-24 | | 0.1 | | ◎◎ | Ni—B COMPOUND | EXAMPLE |
| 2-25 | | 0.4 | | ◎◎ | Ni—B COMPOUND | EXAMPLE |
| 2-26 | | 1 | | ◎◎ | Ni—B COMPOUND | EXAMPLE |
| 2-27 | | 25 | | ◎◎ | Ni—B COMPOUND | EXAMPLE |
| 2-28 | | 50 | | ◎◎ | Ni—B COMPOUND | EXAMPLE |
| 2-29 | | 60 | | ◎○ | Ni—B COMPOUND | EXAMPLE |
| 2-30 | | 100 | | ◎○ | Ni—B COMPOUND | EXAMPLE |
| 2-31 | | 120 | | ◎ | Ni—B COMPOUND | EXAMPLE |
| 2-32 | | 180 | | ◎ | Ni—B COMPOUND | EXAMPLE |
| 2-33 | | 200 | | ◎ | Ni—B COMPOUND | EXAMPLE |
| 2-34 | | 220 | | X | Ni—B COMPOUND | COMPARATIVE EXAMPLE |
| 2-35 | Sn—2Ag—0.5Cu—0.5Fe | 0 | ~222 | X | NO-ADDITION | COMPARATIVE EXAMPLE |
| 2-36 | | 25 | | ◎○ | METAL BORON | EXAMPLE |
| 2-37 | | 0.05 | | X | Fe—B EUTECTIC | COMPARATIVE EXAMPLE |
| 2-38 | | 0.1 | | ◎◎ | Fe—B EUTECTIC | EXAMPLE |
| 2-39 | | 0.4 | | ◎◎ | Fe—B EUTECTIC | EXAMPLE |
| 2-40 | | 1 | | ◎◎ | Fe—B EUTECTIC | EXAMPLE |
| 2-41 | | 25 | | ◎◎ | Fe—B EUTECTIC | EXAMPLE |
| 2-42 | | 50 | | ◎◎ | Fe—B EUTECTIC | EXAMPLE |
| 2-43 | | 60 | | ◎○ | Fe—B EUTECTIC | EXAMPLE |
| 2-44 | | 100 | | ◎○ | Fe—B EUTECTIC | EXAMPLE |
| 2-45 | | 120 | | ◎ | Fe—B EUTECTIC | EXAMPLE |
| 2-46 | | 180 | | ◎ | Fe—B EUTECTIC | EXAMPLE |
| 2-47 | | 200 | | ◎ | Fe—B EUTECTIC | EXAMPLE |
| 2-48 | | 220 | | X | Fe—B EUTECTIC | COMPARATIVE EXAMPLE |
| 2-49 | Sn—1.2Ag—1.0Cu | 0 | ~226 | X | NO-ADDITION | COMPARATIVE EXAMPLE |
| 2-50 | | 0.05 | | X | METAL BORON | COMPARATIVE EXAMPLE |
| 2-51 | | 0.05 | | X | Cu—B SOLID SOLUTION | COMPARATIVE EXAMPLE |
| 2-52 | | 0.1 | | ◎○ | METAL BORON | EXAMPLE |
| 2-53 | | 0.1 | | ◎◎ | Cu—B SOLID SOLUTION | EXAMPLE |
| 2-54 | | 0.4 | | ◎○ | METAL BORON | EXAMPLE |
| 2-55 | | 0.4 | | ◎◎ | Cu—B SOLID SOLUTION | EXAMPLE |
| 2-56 | | 1 | | ◎○ | METAL BORON | EXAMPLE |
| 2-57 | | 1 | | ◎◎ | Cu—B SOLID SOLUTION | EXAMPLE |
| 2-58 | | 5 | | ◎○ | METAL BORON | EXAMPLE |
| 2-59 | | 5 | | ◎◎ | Cu—B SOLID SOLUTION | EXAMPLE |

TABLE 3

| NO. | COMPOSITION (MASS %) OF SOLDER ALLOY | B CONTENT (MASS ppm) | MELTING TEMPERATURE (° C.) | DROP IMPACT RESISTANCE | BORON ADDITION MATERIAL | REMARKS |
|---|---|---|---|---|---|---|
| 3-1 | Sn—2.5Ag—0.5Cu—0.5Ni—0.5Fe | 0 | ~221 | X | NO-ADDITION | COMPARATIVE EXAMPLE |
| 3-2 | | 0.05 | | X | METAL BORON | COMPARATIVE EXAMPLE |
| 3-3 | | 0.1 | | ◎○ | METAL BORON | EXAMPLE |
| 3-4 | | 0.4 | | ◎○ | METAL BORON | EXAMPLE |
| 3-5 | | 1 | | ◎○ | METAL BORON | EXAMPLE |
| 3-6 | | 25 | | ◎○ | METAL BORON | EXAMPLE |
| 3-7 | | 50 | | ◎○ | METAL BORON | EXAMPLE |
| 3-8 | | 60 | | ◎ | METAL BORON | EXAMPLE |
| 3-9 | | 100 | | ◎ | METAL BORON | EXAMPLE |
| 3-10 | | 120 | | ○ | METAL BORON | EXAMPLE |
| 3-11 | | 180 | | ○ | METAL BORON | EXAMPLE |
| 3-12 | | 200 | | ○ | METAL BORON | EXAMPLE |
| 3-13 | | 220 | | X | METAL BORON | COMPARATIVE EXAMPLE |
| 3-14 | | 0.05 | | X | Fe—B EUTECTIC | COMPARATIVE EXAMPLE |
| 3-15 | | 0.1 | | ◎◎ | Fe—B EUTECTIC | EXAMPLE |
| 3-16 | | 0.4 | | ◎◎ | Fe—B EUTECTIC | EXAMPLE |
| 3-17 | | 1 | | ◎◎ | Fe—B EUTECTIC | EXAMPLE |
| 3-18 | | 25 | | ◎◎ | Fe—B EUTECTIC | EXAMPLE |
| 3-19 | | 50 | | ◎◎ | Fe—B EUTECTIC | EXAMPLE |
| 3-20 | | 60 | | ◎○ | Fe—B EUTECTIC | EXAMPLE |
| 3-21 | | 100 | | ◎○ | Fe—B EUTECTIC | EXAMPLE |
| 3-22 | | 120 | | ◎ | Fe—B EUTECTIC | EXAMPLE |
| 3-23 | | 180 | | ◎ | Fe—B EUTECTIC | EXAMPLE |
| 3-24 | | 200 | | ◎ | Fe—B EUTECTIC | EXAMPLE |
| 3-25 | | 220 | | X | Fe—B EUTECTIC | COMPARATIVE EXAMPLE |
| 3-26 | | 0.05 | | X | Cu—B EUTECTIC | COMPARATIVE EXAMPLE |
| 3-27 | | 0.1 | | ◎◎○ | Cu—B EUTECTIC | EXAMPLE |
| 3-28 | | 0.5 | | ◎◎○ | Cu—B EUTECTIC | EXAMPLE |
| 3-29 | | 1 | | ◎◎○ | Cu—B EUTECTIC | EXAMPLE |
| 3-30 | | 25 | | ◎◎○ | Cu—B EUTECTIC | EXAMPLE |
| 3-31 | | 50 | | ◎◎○ | Cu—B EUTECTIC | EXAMPLE |
| 3-32 | | 60 | | ◎◎ | Cu—B EUTECTIC | EXAMPLE |
| 3-33 | | 100 | | ◎◎ | Cu—B EUTECTIC | EXAMPLE |
| 3-34 | | 120 | | ◎○ | Cu—B EUTECTIC | EXAMPLE |
| 3-35 | | 180 | | ◎○ | Cu—B EUTECTIC | EXAMPLE |
| 3-36 | | 200 | | ◎○ | Cu—B EUTECTIC | EXAMPLE |
| 3-37 | | 220 | | X | Cu—B EUTECTIC | COMPARATIVE EXAMPLE |
| 3-38 | | 0.05 | | X | Ni—B COMPOUND | COMPARATIVE EXAMPLE |
| 3-39 | | 0.1 | | ◎◎○ | Ni—B COMPOUND | EXAMPLE |
| 3-40 | | 0.4 | | ◎◎○ | Ni—B COMPOUND | EXAMPLE |
| 3-41 | | 1 | | ◎◎○ | Ni—B COMPOUND | EXAMPLE |
| 3-42 | | 25 | | ◎◎○ | Ni—B COMPOUND | EXAMPLE |
| 3-43 | | 50 | | ◎◎○ | Ni—B COMPOUND | EXAMPLE |
| 3-44 | | 60 | | ◎◎ | Ni—B COMPOUND | EXAMPLE |
| 3-45 | | 100 | | ◎◎ | Ni—B COMPOUND | EXAMPLE |
| 3-46 | | 120 | | ◎○ | Ni—B COMPOUND | EXAMPLE |
| 3-47 | | 180 | | ◎○ | Ni—B COMPOUND | EXAMPLE |
| 3-48 | | 200 | | ◎○ | Ni—B COMPOUND | EXAMPLE |
| 3-49 | | 220 | | X | Ni—B COMPOUND | COMPARATIVE EXAMPLE |

TABLE 4

| NO. | COMPOSITION (MASS %) OF SOLDER ALLOY | B CONTENT (MASS ppm) | MELTING TEMPERATURE (° C.) | DROP IMPACT RESISTANCE | BORON ADDITION MATERIAL | REMARKS |
|---|---|---|---|---|---|---|
| 4-1 | | 0.05 | | X | Cu—B EUTECTIC AND Ni—B COMPOUND | COMPARATIVE EXAMPLE |
| 4-2 | | 0.1 | | ◎◎○ | Cu—B EUTECTIC AND Ni—B COMPOUND | EXAMPLE |
| 4-3 | | 0.4 | | ◎◎○ | Cu—B EUTECTIC AND Ni—B COMPOUND | EXAMPLE |
| 4-4 | | 1 | | ◎◎○ | Cu—B EUTECTIC AND Ni—B COMPOUND | EXAMPLE |
| 4-5 | | 25 | | ◎◎○ | Cu—B EUTECTIC AND Ni—B COMPOUND | EXAMPLE |
| 4-6 | | 50 | | ◎◎○ | Cu—B EUTECTIC AND Ni—B COMPOUND | EXAMPLE |
| 4-7 | | 60 | | ◎◎ | Cu—B EUTECTIC AND Ni—B COMPOUND | EXAMPLE |
| 4-8 | | 100 | | ◎◎ | Cu—B EUTECTIC AND Ni—B COMPOUND | EXAMPLE |

TABLE 4-continued

| NO. | COMPOSITION (MASS %) OF SOLDER ALLOY | B CONTENT (MASS ppm) | MELTING TEMPERATURE (° C.) | DROP IMPACT RESISTANCE | BORON ADDITION MATERIAL | REMARKS |
|---|---|---|---|---|---|---|
| 4-9 | | 120 | | ⊚○ | Cu—B EUTECTIC AND Ni—B COMPOUND | EXAMPLE |
| 4-10 | | 180 | | ⊚○ | Cu—B EUTECTIC AND Ni—B COMPOUND | EXAMPLE |
| 4-11 | | 200 | | ⊚○ | Cu—B EUTECTIC AND Ni—B COMPOUND | EXAMPLE |
| 4-12 | | 220 | | X | Cu—B EUTECTIC AND Ni—B COMPOUND | COMPARATIVE EXAMPLE |
| 4-13 | Sn—1.2Ag—0.7Cu—0.05Ni | 0 | ~226 | X | Cu—B SOLID SOLUTION AND Ni—B COMPOUND | COMPARATIVE EXAMPLE |
| 4-14 | | 0.05 | | X | Cu—B SOLID SOLUTION AND Ni—B COMPOUND | COMPARATIVE EXAMPLE |
| 4-15 | | 0.1 | | ⊚◎○ | Cu—B SOLID SOLUTION AND Ni—B COMPOUND | EXAMPLE |
| 4-16 | | 0.4 | | ⊚◎○ | Cu—B SOLID SOLUTION AND Ni—B COMPOUND | EXAMPLE |
| 4-17 | | 1 | | ⊚◎○ | Cu—B SOLID SOLUTION AND Ni—B COMPOUND | EXAMPLE |
| 4-18 | | 5 | | ⊚◎○ | Cu—B SOLID SOLUTION AND Ni—B COMPOUND | EXAMPLE |
| 4-19 | | 25 | | ⊚◎○ | Cu—B SOLID SOLUTION AND Ni—B COMPOUND | EXAMPLE |
| 4-20 | | 50 | | ⊚◎○ | Cu—B SOLID SOLUTION AND Ni—B COMPOUND | EXAMPLE |
| 4-21 | | 60 | | ⊚◎ | Cu—B SOLID SOLUTION AND Ni—B COMPOUND | EXAMPLE |
| 4-22 | | 100 | | ⊚◎ | Cu—B SOLID SOLUTION AND Ni—B COMPOUND | EXAMPLE |
| 4-23 | | 120 | | ⊚○ | Cu—B SOLID SOLUTION AND Ni—B COMPOUND | EXAMPLE |
| 4-24 | | 180 | | ⊚○ | Cu—B SOLID SOLUTION AND Ni—B COMPOUND | EXAMPLE |
| 4-25 | | 200 | | ⊚○ | Cu—B SOLID SOLUTION AND Ni—B COMPOUND | EXAMPLE |
| 4-26 | | 220 | | X | Cu—B SOLID SOLUTION AND Ni—B COMPOUND | COMPARATIVE EXAMPLE |

4-1~4-12: Sn—3Ag—0.5Cu—0.5Ni—0.5Fe

Example 3

In the Example 3, influences by concentrations of Ag and Cu were studied. The melting temperatures of solder alloys shown in Table 5 are not greater than 230° C. in any case. The influences by the Ag concentration on alloys of No. 5-1 to No. 5-11 were studied. The influences by the Cu concentration on alloys No. 5-12 to No. 5-24 were studied. The alloy compositions other than Sn are shown in Table 5. The solder alloy was produced using the high-frequency melting method by weighing each pure metal of the Ag and Cu and Cu—B solid solution so as to have the composition as shown in Table 5. Here, all metals were simultaneously put into a crucible to perform the high-frequency melting so that the solder has the composition shown in Table 5. The analysis of the composition of the produced solder alloy was performed by the ICP and GD-MS method. Wires were formed from each of the produced solder alloys and solder balls each having a diameter of 300 μm were produced by a wiring method. The mounting and evaluation of the solder balls were performed in the same way as in the Example 1. Each of the solder alloys of No. 5-1 to No. 5-11 whose drop impact resistance was lower, equal, improved by not less than 20%, and by not less than 40%, compared with Sn-0.9 wt % Cu-5 ppmB being the alloy of No. 5-1 was expressed, respectively, by symbols of x, ○, ◎, and ⊚○. Each of the solder alloys of No. 5-12 to No. 5-24 whose drop impact resistance was lower, equal, improved by not less than 20%, and by not less than 40%, compared with Sn-1.2 wt % Ag-10 ppmB being the alloy of No. 5-12 was expressed, respectively, by symbols of x, ○, ◎, and ⊚○. The results from the evaluation were shown in the Table 5.

In the case of the alloys (No. 5-3 to No. 5-10) having the Ag concentration of not less than 0.1% by mass and not greater than % by mass, high drop impact resistance was obtained. Especially, in the case of the alloys (No. 5-5 to No. 5-7) having the Ag concentration of not less than 0.3% by mass and not greater than 1.5% by mass, further higher drop impact resistance was observed and, though not shown in FIG. 5, in the thermal fatigue test in which one cycle includes heating and cooling at 125° C. for 20 minutes and −45° C. for 20 minutes, even after 1000 cycles, the excellent drop impact resistance was achieved. In the case of the alloys (No. 5-14 to No. 5-23) having the Cu concentration of not less than 0.01% by mass and not greater than 1.5% by mass, the high drop impact resistance was observed. Especially, in the case of the alloys (No. 5-16 to No. 5-21) having the Cu concentration of not less than 0.05% by mass and not greater than 1.0% by mass, the high drop impact resistance was observed.

TABLE 5

| NO. | Sn—Ag—Cu COMPOSITION (MASS %) OF SOLDER ALLOY Ag | Sn—Ag—Cu COMPOSITION (MASS %) OF SOLDER ALLOY Cu | B CONTENT (MASS ppm) | DROP IMPACT RESISTANCE | BORON ADDITION MATERIAL | REMARKS |
|---|---|---|---|---|---|---|
| 5-1 | 0 | 0.9 | 5 | ○ | Cu—B SOLID SOLUTION | EXAMPLE |
| 5-2 | 0.08 | | | ○ | Cu—B SOLID SOLUTION | EXAMPLE |
| 5-3 | 0.1 | | | ◉ | Cu—B SOLID SOLUTION | EXAMPLE |
| 5-4 | 0.6 | | | ◉ | Cu—B SOLID SOLUTION | EXAMPLE |
| 5-5 | 0.8 | | | ◉○ | Cu—B SOLID SOLUTION | EXAMPLE |
| 5-6 | 1.2 | | | ◉○ | Cu—B SOLID SOLUTION | EXAMPLE |
| 5-7 | 1.5 | | | ◉○ | Cu—B SOLID SOLUTION | EXAMPLE |
| 5-8 | 1.6 | | | ◉ | Cu—B SOLID SOLUTION | EXAMPLE |
| 5-9 | 3 | | | ◉ | Cu—B SOLID SOLUTION | EXAMPLE |
| 5-10 | 5 | | | ◉ | Cu—B SOLID SOLUTION | EXAMPLE |
| 5-11 | 5.5 | | | ○ | Cu—B SOLID SOLUTION | EXAMPLE |
| 5-12 | 1.2 | 0 | 10 | ○ | METAL BORON | EXAMPLE |
| 5-13 | | 0.008 | | ○ | METAL BORON | EXAMPLE |
| 5-14 | | 0.01 | | ◉ | METAL BORON | EXAMPLE |
| 5-15 | | 0.04 | | ◉ | METAL BORON | EXAMPLE |
| 5-16 | | 0.05 | | ◉○ | METAL BORON | EXAMPLE |
| 5-17 | | 0.1 | | ◉○ | METAL BORON | EXAMPLE |
| 5-18 | | 0.5 | | ◉○ | METAL BORON | EXAMPLE |
| 5-19 | | 0.7 | | ◉○ | METAL BORON | EXAMPLE |
| 5-20 | | 0.8 | | ◉○ | METAL BORON | EXAMPLE |
| 5-21 | | 1.0 | | ◉○ | METAL BORON | EXAMPLE |
| 5-22 | | 1.2 | | ◉ | METAL BORON | EXAMPLE |
| 5-23 | | 1.5 | | ◉ | METAL BORON | EXAMPLE |
| 5-24 | | 1.55 | | ○ | METAL BORON | EXAMPLE |

Example 4

In the Example 4, influences by concentrations of Ni were studied. The components other than Sn of the alloy to be evaluated are shown in Table 6. The melting temperature of each alloy is not greater than 230° C. In the Example 4, a Cu—B solid solution as a means of adding B was selected and the high-frequency melting process was performed on the selected solid solution together with other metal elements to produce the solder alloy. The analysis of composition of the produced solder alloy was performed by the ICP and GD-MS method. Solder balls each having a diameter of 300 µm were produced by using the in-air granulation method. The mounting and evaluation of the solder balls were performed in the same way as in the Example 1. Each of the solder alloys shown in Table 6 whose drop impact resistance was lower, equal, improved by not less than 20%, and by not less than 40%, compared with the alloy of No. 5-1 to which no Ni was added was expressed, respectively, by symbols of x, ○, ◉, and ◉○. The results from the evaluation were shown in the Table 6. In the solder alloy having its Ni content being not less than 0.005% by mass and not greater than 0.5% by mass, higher drop impact resistance was obtained (No. 6-3 to No. 6-11). Also, in the solder alloy having its Ni content being not less than 0.01% by mass and not greater than 0.1% by mass, further more excellent drop impact resistance was observed (No. 6-5 to No. 6-9).

TABLE 6

| NO. | Sn—Ag—Cu—Ni COMPOSITION (MASS %) OF SOLDER ALLOY Ag | Sn—Ag—Cu—Ni COMPOSITION (MASS %) OF SOLDER ALLOY Cu | Sn—Ag—Cu—Ni COMPOSITION (MASS %) OF SOLDER ALLOY Ni | B CONTENT (MASS ppm) | DROP IMPACT RESISTANCE | REMARKS |
|---|---|---|---|---|---|---|
| 6-1 | 1.2 | 0.8 | 0 | 5 | ○ | EXAMPLE |
| 6-2 | | | 0.004 | | ○ | EXAMPLE |
| 6-3 | | | 0.005 | | ◉ | EXAMPLE |
| 6-4 | | | 0.008 | | ◉ | EXAMPLE |
| 6-5 | | | 0.01 | | ◉○ | EXAMPLE |
| 6-6 | | | 0.02 | | ◉○ | EXAMPLE |
| 6-7 | | | 0.05 | | ◉○ | EXAMPLE |
| 6-8 | | | 0.08 | | ◉○ | EXAMPLE |
| 6-9 | | | 0.1 | | ◉○ | EXAMPLE |
| 6-10 | | | 0.15 | | ◉ | EXAMPLE |
| 6-11 | | | 0.5 | | ◉ | EXAMPLE |
| 6-12 | | | 0.6 | | ○ | EXAMPLE |

Example 5

In the Example 5, influences by concentrations of Ag, Cu and Ni were studied. The melting temperature of each of solder alloys shown in Table 7 was not greater than 230° C. Boron was added by using an Ni—B compound and Cu—B eutectic alloy. The solder alloy was produced by weighing each pure metal and performing a high-frequency melting process in a nitrogen atmosphere so as to finally have the composition of metals other than Sn, as shown in Table 7. The analysis of composition of the produced solder alloy was performed by the ICP and GD-MS method. Each of the produced solder alloys is drawn to form a wire and then a solder ball was produced by the wire cutting method. The mounting and evaluation of the solder balls were performed in the same way as in the Example 1. Each of the solder alloys shown in Table 7 whose drop impact resistance was lower, equal, improved by not less than 20%, and by not less than 40%, compared with Sn-1 Ag-0.5 Cu to which no B was added was expressed, respectively, by symbols of x, ○, ◉, and ◉○. The results from the evaluation were shown in Table 7.

In the case of the alloy having the Ag content of not less than 0.8% by mass and not greater than 1.5% by mass, the Cu content of not less than 0.05% by mass and more than 1.0% by mass and the Ni content of 0.01% by mass and not less than 0.1% by mass, higher drop impact resistance was obtained (No. 7-2 to No. 7-4, No. 7-7 to No. 7-10, and No. 7-13 to No. 7-17).

TABLE 7

| NO. | Sn—Ag—Cu—Ni COMPOSITION (MASS %) OF SOLDER ALLOY | | | B CONTENT (MASS ppm) | DROP IMPACT RESISTANCE | REMARKS |
|---|---|---|---|---|---|---|
| | Ag | Cu | Ni | | | |
| 7-1 | 0.5 | 0.5 | 0.03 | 25 | ⊚ | EXAMPLE |
| 7-2 | 0.8 | | | | ⊚○ | EXAMPLE |
| 7-3 | 1.2 | | | | ⊚○ | EXAMPLE |
| 7-4 | 1.5 | | | | ⊚○ | EXAMPLE |
| 7-5 | 1.7 | | | | ⊚ | EXAMPLE |
| 7-6 | 1.2 | 0.03 | 0.05 | | ⊚ | EXAMPLE |
| 7-7 | | 0.05 | | | ⊚○ | EXAMPLE |
| 7-8 | | 0.1 | | | ⊚○ | EXAMPLE |
| 7-9 | | 0.8 | | | ⊚○ | EXAMPLE |
| 7-10 | | 1 | | | ⊚○ | EXAMPLE |
| 7-11 | | 1.2 | | | ⊚ | EXAMPLE |
| 7-12 | | 0.6 | 0.008 | | ⊚ | EXAMPLE |
| 7-13 | | | 0.01 | | ⊚○ | EXAMPLE |
| 7-14 | | | 0.02 | | ⊚○ | EXAMPLE |

TABLE 7-continued

| NO. | Sn—Ag—Cu—Ni COMPOSITION (MASS %) OF SOLDER ALLOY | | | B CONTENT (MASS ppm) | DROP IMPACT RESISTANCE | REMARKS |
|---|---|---|---|---|---|---|
| | Ag | Cu | Ni | | | |
| 7-15 | | | 0.05 | | ⊚○ | EXAMPLE |
| 7-16 | | | 0.08 | | ⊚○ | EXAMPLE |
| 7-17 | | | 0.1 | | ⊚○ | EXAMPLE |
| 7-18 | | | 0.15 | | ⊚ | EXAMPLE |

Example 6

In the Example 6, influences by the concentration of P, Ge and Ga were studied. The melting temperature of each of solder alloys was not greater than 230° C. The selected base composition of the solder alloy was obtained by adding 4 mass ppm of B to Sn-1.2 Ag-0.7 Cu. The addition of B was carried out by using a Cu—B solid solution and the addition of P, Ge, and Ga was carried out by using an alloy of P and Sn, Ge and Sn, and Ga and Sn and these materials were weighed so that the solder alloy has composition shown in Table 8. The analysis on the composition of the produced alloys was performed by the ICP and GD-MS methods. The solder ball was produced by an in-air granulation method in a nitrogen atmosphere. The mounting and evaluation of a sample for a drop test were performed in the same way as in the Example 1. Each of the solder alloys shown in Table 8 whose drop impact resistance was lower, equal, improved by not less than 20%, and by not less than 40%, compared with Sn-1.2 Ag-0.7 Cu to which B, P, Ge, and Ga were not added was expressed, respectively, by symbols of x, ○, ⊚, and ⊚○.

In the case of the alloy having the P content of not less than 0.001% by mass and not greater than 0.05% by mass, the Ge content of not less than 0.001% by mass and more than 0.05% by mass and the Ga content of 0.001% by mass and not less than 0.05% by mass, higher drop impact resistance was obtained (No. 8-1, No. 8-2, No. 8-4, No. 8-5, No. 8-7, No. 8-8, and No. 8-10).

TABLE 8

| NO. | Sn—Ag—Cu COMPOSITION (MASS %) OF SOLDER ALLOY | | B CONTENT (MASS ppm) | ADDED ELEMENT (MASS %) | | | DROP IMPACT RESISTANCE | REMARKS |
|---|---|---|---|---|---|---|---|---|
| | Ag | Cu | | P | Ge | Ga | | |
| 8-1 | 1.2 | 0.7 | 4 | 0.001 | 0 | 0 | ⊚○ | EXAMPLE |
| 8-2 | | | | 0.05 | 0 | 0 | ⊚○ | EXAMPLE |
| 8-3 | | | | 0.06 | 0 | 0 | ⊚ | EXAMPLE |
| 8-4 | | | | 0 | 0.001 | 0 | ⊚○ | EXAMPLE |
| 8-5 | | | | 0 | 0.05 | 0 | ⊚○ | EXAMPLE |
| 8-6 | | | | 0 | 0.06 | 0 | ⊚ | EXAMPLE |
| 8-7 | | | | 0 | 0 | 0.001 | ⊚○ | EXAMPLE |
| 8-8 | | | | 0 | 0 | 0.05 | ⊚○ | EXAMPLE |
| 8-9 | | | | 0 | 0 | 0.06 | ⊚ | EXAMPLE |
| 8-10 | | | | 0.01 | 0.01 | 0.01 | ⊚○ | EXAMPLE |

Example 7

In the Example 7, influences by concentrations of Sb were studied. Pure metals of Sn, Ag, Cu, Sb, and B were weighed so that the resulting solder alloy has the composition shown in Table 9 and boron was added in the form of a Cu—B solid solution and these metals were simultaneously alloyed to produce the solder alloy. The analysis of the produced solder alloy was performed by the ICP analysis and GD-MS methods. The produced solder alloy was drawn so as to have a wire-shape and solder balls each with a diameter of 300 μm were produced. The mounting and evaluation were performed in the same way as in the Example 1. Each of the solder alloys shown in Table 9 whose drop impact resistance was less than, equal, improved by not less than 20%, and by not less than 40%, compared with Sn-1.2Ag-1.2Cu (% by mass) to which B was not added and produced in the same way was expressed, respectively, by symbols of x, ○, ⊚, and ⊚○. The results were shown in Table 9.

In the case of the alloy having the Sb content of not less than 0.005% by mass and not greater than 1.0% by mass (No.

9-2 to No. 9-9), higher drop impact resistance was obtained In the case of the alloy having the Sb content of not less than 0.02% by mass and not greater than 0.5% by mass (No. 9-4 and No. 9-5), the highest drop impact resistance was obtained and, though not shown in Table 9, in the thermal fatigue test in which one cycle includes heating and cooling at +125° C. for 20 minutes and −45° C. for 20 minutes, even after 1000 cycles, the excellent drop impact resistance was achieved.

TABLE 9

| NO. | Sn—Ag—Cu COMPOSITION (MASS %) OF SOLDER ALLOY | | B CONTENT (MASS ppm) | ADDED ELEMENT (MASS %) Sb | DROP IMPACT RESISTANCE | REMARKS |
|---|---|---|---|---|---|---|
| | Ag | Cu | | | | |
| 9-1 | 1.2 | 1.2 | 2 | 0.004 | ○ | EXAMPLE |
| 9-2 | | | | 0.005 | ⊚ | EXAMPLE |
| 9-3 | | | | 0.01 | ⊚ | EXAMPLE |
| 9-4 | | | | 0.02 | ⊚○ | EXAMPLE |
| 9-5 | | | | 0.05 | ⊚○ | EXAMPLE |
| 9-6 | | | | 0.08 | ⊚ | EXAMPLE |
| 9-7 | | | | 0.1 | ⊚ | EXAMPLE |
| 9-8 | | | | 0.5 | ⊚ | EXAMPLE |
| 9-9 | | | | 1 | ⊚ | EXAMPLE |
| 9-10 | | | | 1.2 | ○ | EXAMPLE |

Example 8

In the Example 8, effects obtained by the flow soldering was verified. The part used in the verification was 16-pin DIP (Dual In-line Package) with its pitch 2.54 mm and its size of 20×6.5×4 mm. As a board on the mother board side, as in the Example 1, the board being 132×77×1 (mm) in size the surface of which was treated with Cu/Ni/Au was employed. The composition of the solder alloy was Sn-1.2 Ag-1.0 Cu (% by mass) and Sn-1.2 Ag-1.0 Cu-0.0005B (% by mass) and pure metals of Sn, Ag, and Cu and Cu—B solid solution were weighed so that the solder has the above composition and the mother alloy was produced by a heating furnace in a nitrogen atmosphere. The drop test was made on the above part on which flow soldering had been performed using the produced solder alloy and applying, as in the Example 1, waveforms of load acceleration (base, 1500 G, 0.5 ms) regulated in the JEDEC test standard. The evaluation of the drop characteristic was performed in the same way as in the Example 1. That is, a resistance value was monitored every time the test piece was dropped and the number of times of drops occurring before the resistance value became twice as large as its initial resistance was counted for evaluation. As a result, the drop impact resistance of the solder alloy to which boron was added was by 30% improved compared with the solder alloy to which boron was not added.

In the Case of Using a Solder Alloy Whose Surface is Coated with a Boron Containing Layer Example 9

A solder alloy was produced by weighing each metal so as to have the composition as shown in Table 10 and by putting the material into an alumina crucible to perform a high-frequency melting method. The analysis of the composition of the produced solder alloy was performed by ICP and CD-MS method. Each of the produced solder alloys was drawn to produce wires and then the wires were cut by the wire cutting method to produce a solder ball of a diameter of 300 μm.

The surface of the solder ball was coated with a boron-containing layer by an electroless plating method using Ni containing boron. In the electroless plating, a commercially available plating liquid using dimethylamine-boran as a reducing agent was prepared for initial make-up of plating bath with a plating bath temperature of 65° C. and with a plating speed of 8 μm/hour. Moreover, the plating thickness was represented by the boron concentration as shown in Table 10. That is, the plating thickness was set so that the thickness was almost equivalent to the boron concentration as shown in Table 1. By using this, the influence occurring when the surface of the solder ball was coated with the B-containing layer was investigated.

As a sample part on which the solder ball was mounted, an 84-pad CSP with a pitch being 0.5 mm of 6 mm square was used. For the surface treatment on the CSP, Cu/Ni/Au obtained by plating a Cu electrode with Ni and Au was used. As the board on the mother board side, the board being 132×77×1 (mm) in size, the surface of which was treated with Cu/Ni/Au was used. After first mounting balls on the CSP and performing a reflow process to form a bump, the CSP was mounted on the printing board. Water-soluble flux was used. A temperature profile was such that the reflowing process was performed under a condition at a melting temperature plus 30° C. and a substance having composition comprising B was re-flown at the same temperature as a substance having composition not comprising B. The drop impact resistance was evaluated according to the JESD22-B111 test standard regulated by the JEDEC in which a resistance value of each part was monitored for every drop and the number of times of drops occurring when the resistance value became twice its initial value was defined as failure. Each of the solder balls shown in Table 10 whose drop impact resistance was less than, equal, improved by not less than 20%, and by not less than 40%, compared with the solder ball (not same composition) the surface of which was not coated with the B-containing layer was expressed, respectively, by symbols of ×, ○, ⊚, and ⊚○. The results were shown in Table 10.

Table 10 shows that, high drop impact resistance was obtained when the surface of the solder ball was coated with a B-containing substance.

TABLE 10

| NO. | Sn—Ag—Cu COMPOSITION (MASS %) OF SOLDER ALLOY Ag | Cu | B CONTENT (MASS ppm) | DROP IMPACT RESISTANCE | REMARKS |
|---|---|---|---|---|---|
| 10-1 | 0 | 0.9 | 5 | ○ | EXAMPLE |
| 10-2 | 0.08 | | | ○ | EXAMPLE |
| 10-3 | 0.1 | | | ◎ | EXAMPLE |
| 10-4 | 0.6 | | | ◎ | EXAMPLE |
| 10-5 | 0.8 | | | ◎○ | EXAMPLE |
| 10-6 | 1.2 | | | ◎○ | EXAMPLE |
| 10-7 | 1.5 | | | ◎○ | EXAMPLE |
| 10-8 | 1.6 | | | ◎ | EXAMPLE |
| 10-9 | 3 | | | ◎ | EXAMPLE |
| 10-10 | 5 | | | ◎ | EXAMPLE |
| 10-11 | 5.5 | | | ○ | EXAMPLE |
| 10-12 | 1.2 | 0 | 10 | ○ | EXAMPLE |
| 10-13 | | 0.008 | | ○ | EXAMPLE |
| 10-14 | | 0.01 | | ◎ | EXAMPLE |
| 10-15 | | 0.04 | | ◎ | EXAMPLE |
| 10-16 | | 0.05 | | ◎○ | EXAMPLE |
| 10-17 | | 0.1 | | ◎○ | EXAMPLE |
| 10-18 | | 0.5 | | ◎○ | EXAMPLE |
| 10-19 | | 0.7 | | ◎○ | EXAMPLE |
| 10-20 | | 0.8 | | ◎○ | EXAMPLE |
| 10-21 | | 1.0 | | ◎○ | EXAMPLE |
| 10-22 | | 1.2 | | ◎ | EXAMPLE |
| 10-23 | | 1.5 | | ◎ | EXAMPLE |
| 10-24 | | 1.55 | | ○ | EXAMPLE |

Example 10

Next, the example in which a B-containing layer was formed on a surface of a solder ball by painting is described. In the Example 10, the surface of the solder ball was coated with dimethylamine-boron. The solder ball was soaked in a solution prepared by dissolving dimethylamine-boron in acetone and the solution was stirred by a magnetic stirrer. The concentration of the solution and soaking time were determined based on an ICP Optical Emission Spectrometer method and GD-MS analysis method. That is, the boron concentration of the solder ball coated with dimethylamine-boron was analyzed using the ICP and GD-MS methods and was set so as to have almost the same concentration as that of the corresponding solder ball shown in Table 2. In addition, other conditions and evaluation methods are the same as in the example 1. The results are shown in Table 11.

Table 11 shows that, high drop impact resistance was obtained when the surface of the solder ball was coated with the B-containing substance.

TABLE 11

| NO. | Sn—Ag—Cu COMPOSITION (MASS %) OF SOLDER ALLOY Ag | Cu | B CONTENT (MASS ppm) | DROP IMPACT RESISTANCE | REMARKS |
|---|---|---|---|---|---|
| 11-1 | 0 | 0.9 | 5 | ○ | EXAMPLE |
| 11-2 | 0.08 | | | ○ | EXAMPLE |
| 11-3 | 0.1 | | | ◎ | EXAMPLE |
| 11-4 | 0.6 | | | ◎ | EXAMPLE |
| 11-5 | 0.8 | | | ◎○ | EXAMPLE |
| 11-6 | 1.2 | | | ◎○ | EXAMPLE |
| 11-7 | 1.5 | | | ◎○ | EXAMPLE |
| 11-8 | 1.6 | | | ◎ | EXAMPLE |
| 11-9 | 3 | | | ◎ | EXAMPLE |
| 11-10 | 5 | | | ◎ | EXAMPLE |
| 11-11 | 5.5 | | | ○ | EXAMPLE |
| 11-12 | 1.2 | 0 | 10 | ○ | EXAMPLE |
| 11-13 | | 0.008 | | ○ | EXAMPLE |
| 11-14 | | 0.01 | | ◎ | EXAMPLE |
| 11-15 | | 0.04 | | ◎ | EXAMPLE |
| 11-16 | | 0.05 | | ◎○ | EXAMPLE |
| 11-17 | | 0.1 | | ◎○ | EXAMPLE |
| 11-18 | | 0.5 | | ◎○ | EXAMPLE |
| 11-19 | | 0.7 | | ◎○ | EXAMPLE |
| 11-20 | | 0.8 | | ◎○ | EXAMPLE |
| 11-21 | | 1.0 | | ◎○ | EXAMPLE |
| 11-22 | | 1.2 | | ◎ | EXAMPLE |
| 11-23 | | 1.5 | | ◎ | EXAMPLE |
| 11-24 | | 1.55 | | ○ | EXAMPLE |

Example 11

Next, the Example 11 in which a boron-containing substance was formed on the surface of an electrode is described. In the Example 11, the solder ball not coated with the B-containing layer was used and a side surface of an electrode to be welded was coated with an electroless Ni plating layer comprising boron. The composition of a plating bath and bath temperature were the same as above and plating thickness was 5 μm. In addition, other conditions were the same as in the Example 1. The results are shown in Table 12. Each of the solder balls shown in Table 12 whose drop impact resistance was less than, equal, improved by not less than 20%, and by not less than 40%, compared with the case in which the surface of the electrode is not coated with the B-containing layer was expressed, respectively, by symbols of x, ○, ◎, and ◎○. The boron concentration occurring in the region being at least 5 μm upward and downward from both sides centered on an interface between the solder bump and an electrode was not less than 0.5 mass ppm.

Table 12 shows that, even when the B-containing layer was formed on the surface of the electrode, higher drop impact resistance was obtained compared with the case in which the B-containing layer was not formed on the surface of the solder ball or the surface of the electrode.

Thus, when the B-containing layer is formed on either of the surface of the solder ball or the surface of the electrode, the higher drop impact resistance can be obtained.

TABLE 12

| NO. | Sn—Ag—Cu COMPOSITION (MASS %) OF SOLDER ALLOY Ag | Cu | DROP IMPACT RESISTANCE | REMARKS |
|---|---|---|---|---|
| 12-1 | 0 | 0.9 | ○ | EXAMPLE |
| 12-2 | 0.08 | | ○ | EXAMPLE |
| 12-3 | 0.1 | | ◎ | EXAMPLE |
| 12-4 | 0.6 | | ◎ | EXAMPLE |
| 12-5 | 0.8 | | ◎○ | EXAMPLE |
| 12-6 | 1.2 | | ◎○ | EXAMPLE |
| 12-7 | 1.5 | | ◎○ | EXAMPLE |
| 12-8 | 1.6 | | ◎ | EXAMPLE |
| 12-9 | 3 | | ◎ | EXAMPLE |

TABLE 12-continued

| NO. | Sn—Ag—Cu COMPOSITION (MASS %) OF SOLDER ALLOY | | DROP IMPACT RESISTANCE | REMARKS |
|---|---|---|---|---|
| | Ag | Cu | | |
| 12-10 | 5 | | ◎ | EXAMPLE |
| 12-11 | 5.5 | | ○ | EXAMPLE |
| 12-12 | 1.2 | 0 | ○ | EXAMPLE |
| 12-13 | | 0.008 | ○ | EXAMPLE |
| 12-14 | | 0.01 | ◎ | EXAMPLE |
| 12-15 | | 0.04 | ◎ | EXAMPLE |
| 12-16 | | 0.05 | ◎○ | EXAMPLE |
| 12-17 | | 0.1 | ◎○ | EXAMPLE |
| 12-18 | | 0.5 | ◎○ | EXAMPLE |
| 12-19 | | 0.7 | ◎○ | EXAMPLE |
| 12-20 | | 0.8 | ◎○ | EXAMPLE |
| 12-21 | | 1.0 | ◎○ | EXAMPLE |
| 12-22 | | 1.2 | ◎ | EXAMPLE |
| 12-23 | | 1.5 | ◎ | EXAMPLE |
| 12-24 | | 1.55 | ○ | EXAMPLE |

The present invention is not limited to these examples described above. In the above examples, the cases where the solder balls each having a diameter of 300 μm were produced using each of the produced solder alloys according to the wire cutting method or in-air granulation method. However, the present invention is not limited to these and even if other producing methods are employed, the same characteristics are obtained and no difference in characteristics among solder balls was found and the property does not depend on the producing methods.

The invention claimed is:

1. A solder alloy comprising:
    not less than 0.1 mass ppm and not greater than 50 mass ppm of boron; and
    a remainder comprising not less than 40% by mass of tin, wherein the solder alloy has a melting temperature of less than 250° C., and
    wherein the boron is added by using at least one boron-containing substance selected from among a copper-boron solid solution, a copper-boron eutectic, a nickel-boron compound, and an iron-boron eutectic.

2. The solder alloy according to claim 1, comprising silver and copper, wherein a content of the silver is not less than 0.1% by mass and not greater than 5% by mass and a content of the copper is not less than 0.01% by mass and not greater than 1.5% by mass.

3. The solder alloy according to claim 1, comprising nickel, wherein a content of the nickel is not less than 0.005% by mass and not greater than 0.5% by mass.

4. The solder alloy according to claim 1, comprising silver, copper and nickel, wherein a content of the silver is not less than 0.8% by mass and not greater than 1.5% by mass, a content of the copper is not less than 0.05% by mass and not greater than 1.0% by mass and a content of the nickel is not less than 0.01% by mass and not greater than 0.1% by mass.

5. The solder alloy according to claim 1, comprising at least one of phosphorous, germanium and gallium, wherein a content of the phosphorous is not greater than 0.05% by mass, a content of the germanium is not greater than 0.05% by mass, and a content of the gallium is not greater than 0.05% by mass.

6. The solder alloy according to claim 1, comprising antimony, wherein a content of the antimony is not less than 0.005% by mass and not greater than 1.0% by mass.

7. The solder alloy according to claim 1, comprising lead, wherein a content of the lead is not greater than 0.1% by mass.

8. A solder ball comprising the solder alloy stated in claim 1, wherein a spherical diameter thereof is not greater than 1 mm.

9. The solder alloy according to claim 1, wherein the boron-containing substance comprises either a combination of a copper-boron eutectic and a nickel-boron compound or a combination of a copper-boron solid solution and a nickel-boron compound.

10. The solder alloy according to claim 1, wherein said solder alloy contains not less than 0.1 mass ppm and not greater than 25 mass ppm of boron.

* * * * *